United States Patent [19]
Yu

[11] Patent Number: 5,991,233
[45] Date of Patent: Nov. 23, 1999

[54] SWITCH SIGNAL GENERATORS FOR SIMULTANEOUSLY SETTING INPUT/ OUTPUT DATA PATHS, AND HIGH-SPEED SYNCHRONOUS SRAM DEVICES USING THE SAME

[75] Inventor: Hak-soo Yu, Seoul, Rep. of Korea

[73] Assignee: Samsung Electronics Co., Ltd., Rep. of Korea

[21] Appl. No.: 08/947,090

[22] Filed: Oct. 8, 1997

[30] Foreign Application Priority Data

Jan. 29, 1997 [KR] Rep. of Korea ................ 97-2676

[51] Int. Cl.[6] .................................................. G11C 8/00
[52] U.S. Cl. ...................................... 365/238.5; 365/233
[58] Field of Search ............................. 365/238.5, 233

[56] References Cited

U.S. PATENT DOCUMENTS 5,319,253 6/1994 You .................................... 307/265

FOREIGN PATENT DOCUMENTS

0 498 895 A1 8/1992 European Pat. Off. .
0 511 423 A1 11/1992 European Pat. Off. .

*Primary Examiner*—David Nelms
*Assistant Examiner*—Hien Nguyen
*Attorney, Agent, or Firm*—Myers Bigel Sibley & Sajovec

[57] ABSTRACT

A switch signal generator simultaneously sets every input and output data path in a high-speed synchronous SRAM. The switch signal generator receives control signals and a plurality of input signals, generates a plurality of switch signals, and sequentially enables other switch signals when a first switch signal of the plurality of switch signals is enabled. The synchronous SRAM includes an output data path/data storing portion, an input data path/data storing portion, and a path switch controlling portion. All burst orders are set simultaneously in the path switch controlling portion including the switch signal generator when a burst operation starts, and all data paths of the output data path/data storing portion and the input data path/data storing portion are simultaneously set by switch control signals which are provided by the path switch controlling portion.

37 Claims, 8 Drawing Sheets

| INTERLEAVE BURST | CASE1 | | CASE2 | | CASE3 | | CASE4 | |
|---|---|---|---|---|---|---|---|---|
| | A1 | A0 | A1 | A0 | A1 | A0 | A1 | A0 |
| FIRST ADDRESS ↓ FOURTH ADDRESS | 0 | 0 | 0 | 1 | 1 | 0 | 1 | 1 |
| | 0 | 1 | 0 | 0 | 1 | 1 | 1 | 0 |
| | 1 | 0 | 1 | 1 | 0 | 0 | 0 | 1 |
| | 1 | 1 | 1 | 0 | 0 | 1 | 0 | 0 |

| LINEAR BURST | CASE1 | | CASE2 | | CASE3 | | CASE4 | |
|---|---|---|---|---|---|---|---|---|
| | A1 | A0 | A1 | A0 | A1 | A0 | A1 | A0 |
| FIRST ADDRESS ↓ FOURTH ADDRESS | 0 | 0 | 0 | 1 | 1 | 0 | 1 | 1 |
| | 0 | 1 | 1 | 0 | 1 | 1 | 0 | 0 |
| | 1 | 0 | 1 | 1 | 0 | 0 | 0 | 1 |
| | 1 | 1 | 0 | 0 | 0 | 1 | 1 | 0 |

SWITCH SIGNAL GENERATORS FOR SIMULTANEOUSLY SETTING INPUT/ OUTPUT DATA PATHS, AND HIGH-SPEED SYNCHRONOUS SRAM DEVICES USING THE SAME

FIELD OF THE INVENTION

The present invention relates to integrated circuit memory devices, and more particularly, to switch signal generators and high-speed synchronous SRAM devices using the same.

BACKGROUND OF THE INVENTION

High-sped integrated circuit Static Random Access Memory (SRAM) devices are widely used, for example as a cache memory of a system. Cache memory is increasingly being used as the difference in speeds between a Central Processing Unit (CPU) and a Dynamic Random Access Memory (DRAM) becomes greater. Standard SRAMs of 10–20 ns speed are typically being used in systems operating at speeds of 100 Mhz or less. Moreover, there is an increasing need for high-speed synchronous SRAMs of 100–220 Mhz speeds to accommodate increases in the clock frequencies of CPUs. Hence, synchronous SRAMs have been used as cache SRAMs in low-end personal computers as well as products such as high-end workstations and servers.

Synchronous SRAMs may be divided into synchronous pipeline types and synchronous burst types. The former may be used as a cache SRAM in Reduced Instruction Set Computer (RISC) chips, whereas the latter may be used as a cache SRAM for Complex Instruction Set Computer (CISC) chips such as those marketed by Intel and Motorola. The present invention relates to synchronous burst SRAM devices.

Figure 1:
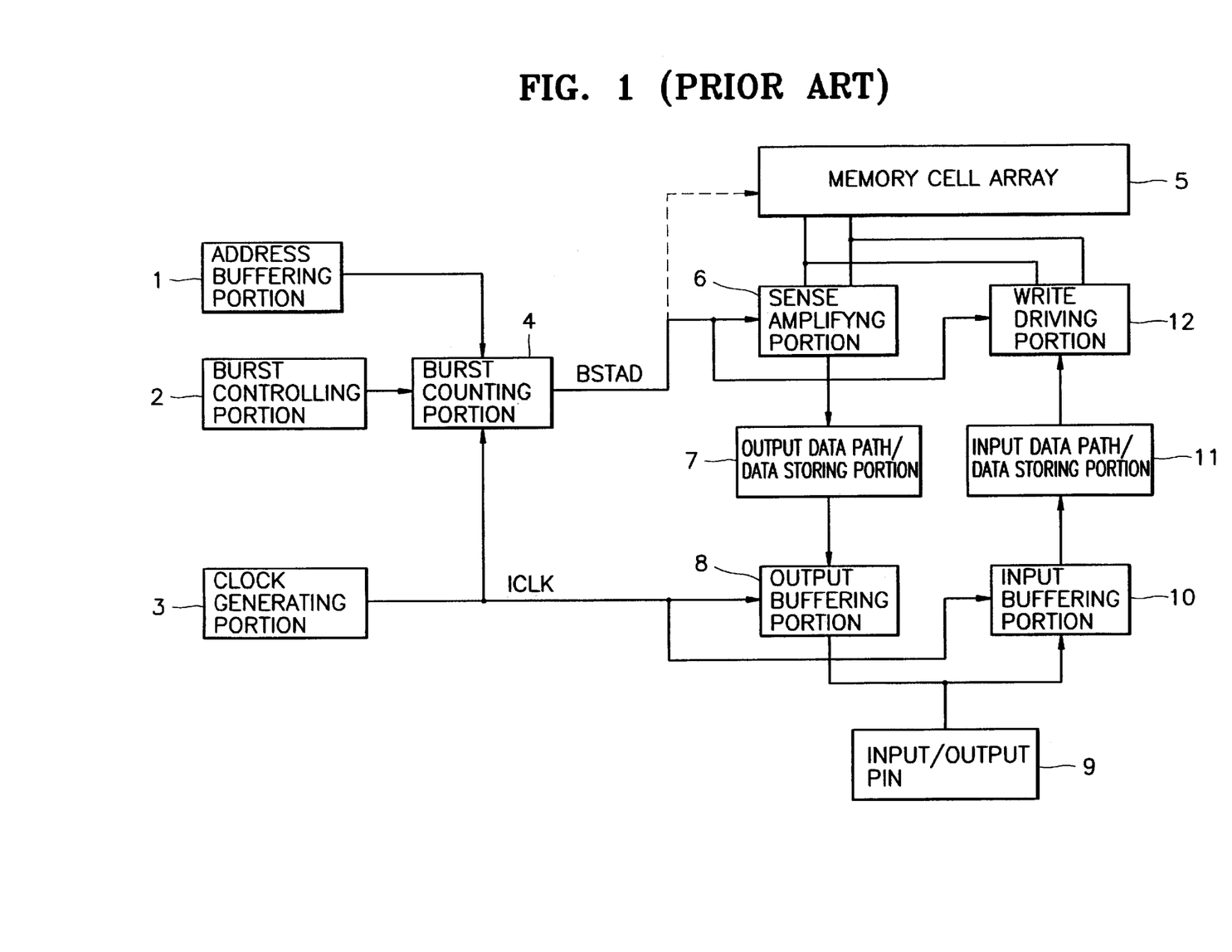
FIG. 1 is a schematic block diagram of a conventional synchronous SRAM.

FIG. 1 is a schematic block diagram of a conventional synchronous burst SRAM, centered around a burst control scheme. For ease of explanation, a read/write control path is not shown.

Referring to FIG. 1, a conventional synchronous SRAM has an address buffering portion 1, a burst controlling portion 2, a clock generating portion 3, and a burst counting portion 4. In addition, a conventional synchronous SRAM further includes a memory cell array 5, a sense amplifying portion 6, an output data path/data storing portion 7, an output buffer 8, and an input/output pin 9. A conventional synchronous SRAM also includes an input buffering portion 10, an input data path/data storing portion 11, and a write driving portion 12.

In a conventional synchronous SRAM of FIG. 1, the transmission sequences of output data and input data are determined by controlling the sense amplifying portion 6 and the write driving portion 12, or a word line or column selection line of the memory cell array 5, using the burst address signal BSTAD. BSTAD is the output signal of the burst counting portion 4.

Figure 2:
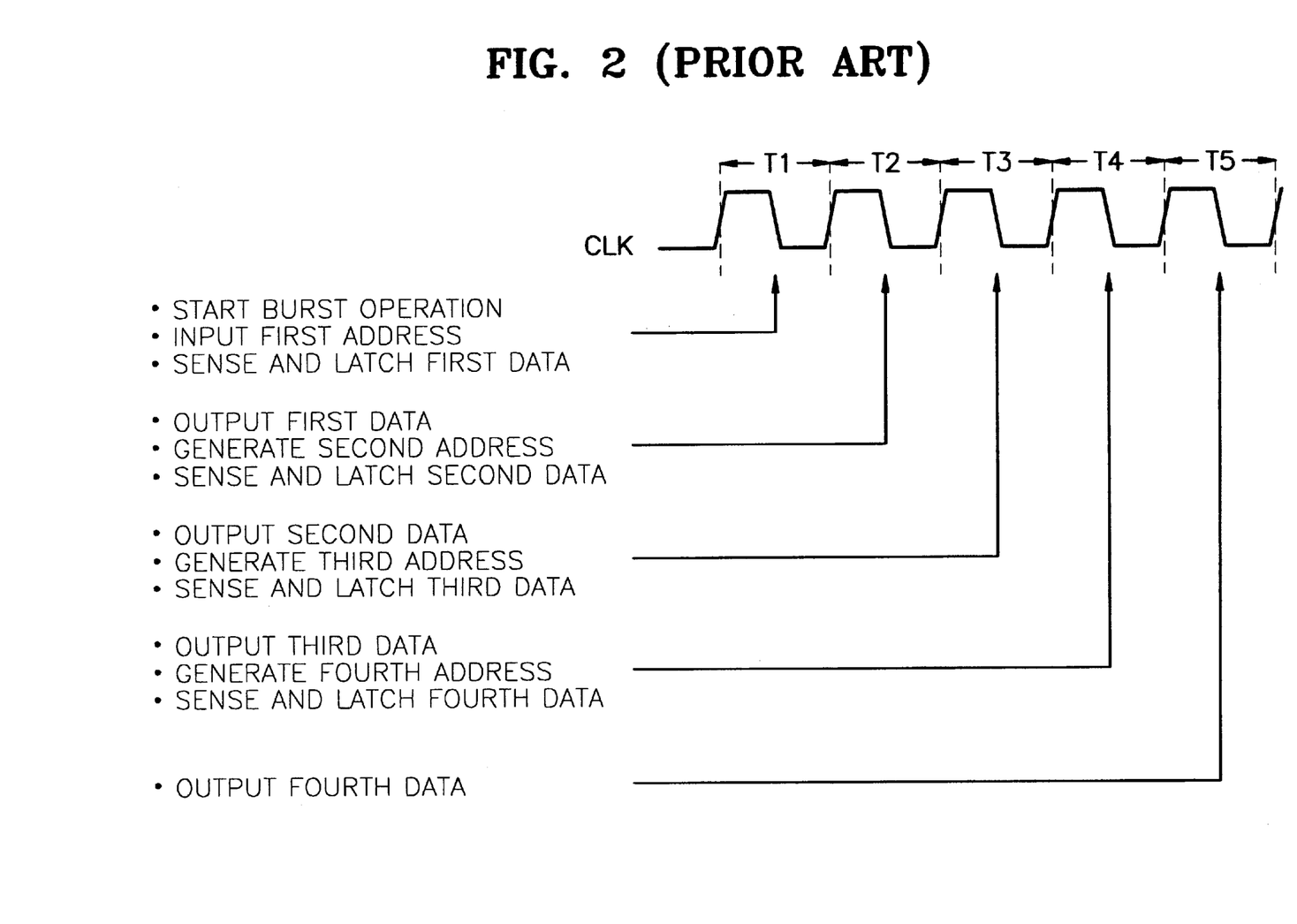
FIG. 2 is a timing diagram illustrating a burst read operation of a conventional synchronous SRAM shown in FIG. 1.

FIG. 2 is a timing diagram illustrating the burst read operation of a conventional synchronous SRAM shown in FIG. 1. Referring to FIG. 2, when a burst read operation is performed in the conventional synchronous SRAM of FIG. 1, the burst address (BSTAD) is generated in the burst counting portion 4, the data of a memory cell is sensed in the sense amplifying portion 6, and the sensed data is latched in the output data path/data storing portion 7, during each of cycles T2, T3, and T4 but not during the first and fifth cycles T1 and T5. Thus, the processes of sensing, latching, and outputting data are controlled by the burst counting portion 4 during every cycle of the system clock signal CLK.

When an ultra high-speed burst read operation is performed in a conventional synchronous SRAM, using a high-speed system clock signal CLK, the cycle time for generating burst addresses and sensing, latching, and outputting data may decrease, thus possibly causing errors in the synchronous SRAM. When the frequency of the system clock signal CLK increases and the periods of the cycles decrease, similar errors may occur during the burst write operation. Furthermore, it may be difficult to read or write data in pairs during a single cycle to implement a double data rate function in a conventional synchronous SRAM of FIG. 1.

SUMMARY OF THE INVENTION

It is therefore an object of the present invention to provide synchronous SRAM devices that can perform high-speed burst operations.

It is another object of the present invention to provide controlling circuits for synchronous SRAM devices that can allow performance of high-speed burst operations.

It is yet another object of the present invention to provide synchronous SRAM devices that can read or write data in pairs during a single cycle to allow a double data rate function.

These and other objects are provided according to the invention by simultaneously setting a plurality of read output data paths and/or write input data paths in a synchronous SRAM device. Accordingly, multiple bits may be sensed and latched and/or latched and written in the synchronous SRAM devices during a single clock cycle. High-speed synchronous SRAM devices may thereby be provided.

In particular, synchronous SRAM devices of the present invention comprise output data path setting means, also referred to as an output data path/data storing portion, that stores output signals of a sense amplifying portion, and simultaneously sets output paths of the output signals in response to switch control signals. Input data path setting means, also referred to as an input data path/data storing portion, stores signals buffered in an input buffering portion, and simultaneously sets input paths of the buffered signals in response to the switch control signals. A path switch-controlling portion generates the switch control signals in response to predetermined address bits and predetermined first and second control signals.

Synchronous SRAM devices of the present invention further include a sense amplifying portion, an output buffering portion, an input buffering portion, and a write driving portion. The sense-amplifying portion simultaneously senses and amplifies data from memory cells and outputs the amplified data to the output data path/data storing portion. The output buffering portion buffers output signals of the output data path/data storing portion in response to an internal clock signal and outputs the buffered signals. The input buffering portion buffers a plurality of externally input signals in response to the internal clock signal and outputs the buffered signals to the input data path/data storing portion. The write driving portion writes output signals of the input data path/data storing portion in memory cells.

The address bits are generated by an externally received address during a burst mode operation. The first control signal indicates the end or stop of the burst mode operation. The second control signal enables the path switch controlling portion, and selects either a linear burst mode or an interleaved burst mode.

The output data path/data storing portion comprises a read data register block for storing output signals of the sense amplifying portion, a plurality of output data path lines, and a path switch block for connecting the output terminals of the read data register block to the respective output data path lines in response to the switch control signals. An output data register block is also included for storing signals transmitted through the respective data path lines and outputting the stored signals to the output buffering portion.

The input data path/data storing portion comprises a write data register block for storing signals input to the input terminals thereof and outputting the stored signals to the write driving portion, a plurality of input data path lines and a path switch block for connecting the input terminals to the respective input data path lines in response to the switch control signals. An input data buffering portion is also included for storing signals buffered in the input buffering portion and outputting the buffered signals through the respective input data path lines.

The path switch controlling portion comprises first switch signal generating means for generating a first group of switch signals in response to the first and second control signals, the address bits, and inverted address bits of the address bits, and second switch signal generating means for generating a second group of switch signals in response to the first control signal, an inverted signal of the second control signal, the address bits, and the inverted address bits. Logic means having a plurality of OR means is also included for OR operating one of the first group of switch signals and one of the second group of switch signals and generating the respective switch control signals.

The first switch signal generating means includes a plurality of unit switch signal generators for generating some of the first group of switch signals as output signals in response to bits selected from the address bits and the inverted address bits, and the first and second control signals, and sequentially enabling the other output signals when a first output signal among the output signals is enabled. The second switch signal generating means includes a plurality of unit switch signal generators for generating some of the second group of switch signals as output signals in response to the bits selected from the address bits and the inverted address bits, and the first signal, and the inverted signal of the second control signal, and sequentially enabling the other output signals when a first output signal among the output signals is enabled.

Switch signal generators of the present invention comprise first logic means responsive to first and second control signals and a plurality of input signals, for performing logic operations on the received signals to generate a first switch signal. Second logic means is responsive to the first switch signal and the first control signal, for sequentially generating other switch signals, and for sequentially enabling the other switch signals when the first switch signal is enabled.

The first logic means comprises NOR means, response to the first and second control signals, for NOR-operating the received signals, and AND means, responsive to the NOR means and the plurality of input signals, for AND-operating the received signals, and generating the first switch signal. The second logic means comprises a plurality of serially connected unit logic means. The unit logic means each include inverting means for inverting a switch signal output from the preceding unit logic means, and NOR means for receiving the output signal of the inverting means and the first control signal, NOR-operating the received signals, to generate a switch signal.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
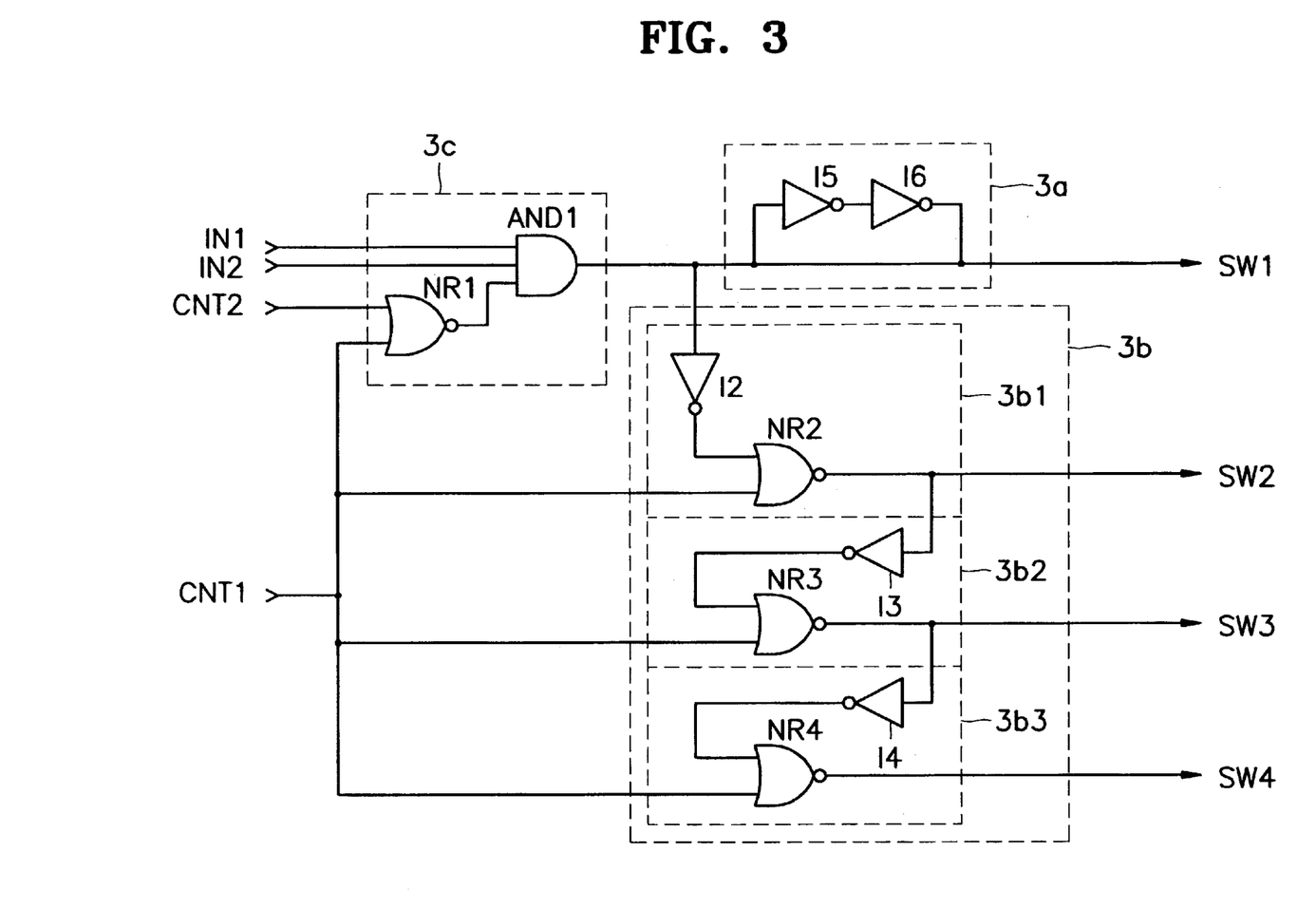
FIG. 3 is a circuit diagram of switch signal generators according to an embodiment of the present invention.

FIG. 3 is a circuit diagram of switch signal generators according to an embodiment of the present invention. Referring to FIG. 3, a switch signal generator according to an embodiment of the present invention includes a first logic means 3c for receiving first and second control signals from both control ports CNT1 and CNT2, and input signals from both input ports IN1 and IN2, performing logic operations on the signals, and generating a first switch signal to an output port SW1. A line latch 3a for latching the first switch signal is also included. The switch signal generator further includes a second logic means 3b for receiving the first switch signal and the first control signal, sequentially generating second through fourth switch signals to respective output ports SW2, SW3, and SW4, and sequentially enabling the second through fourth switch signals when the first switch signal is enabled.

The first logic means 3c includes a NOR gate NR1 for NOR-operating the first and second control signals received from both the control ports CNT1 and CNT2, and an AND gate AND1 for AND-operating an output signal of the NOR gate NR1 and the signals received from both the input ports IN1 and IN2, and generating the first switch signal to the output port SW1. The line latch 3a includes an inverter 15 having an input terminal connected to an output terminal of the AND gate AND1, and an inverter 16 having an input terminal connected to the output terminal of the inverter 15 and an output terminal connected to the output terminal of the AND gate AND1. In addition, the second logic means 3b includes three sequentially connected unit logic means 3b1, 3b2, and 3b3. The unit logic means 3b1, 3b2, and 3b3 include respective inverters I2, I3, and I4 for inverting switch signals of their previous unit logic means and respective NOR gates NR2, NR3, and NR4 for NOR-operating signals received from the inverters I2, I3, and I4 and the first control signal, and generating switch signals.

The switch signal generator of FIG. 3 operates as follows: When either of the first and second control signals received respectively from the control ports CNT1 and CNT2 is logic high, all the switch signals output to the output ports SW1–SW4 become logic low. When both the first and second control signals received from the control ports CNT1 and CNT2 are logic low, the states of the output ports SW1–SW4 are determined by the signals received from the input ports IN1 and IN2. That is, when both the signals received from the input ports IN1 and IN2 are logic low, or either of the signals is logic low, all the switch signals output to the output ports SW1–SW4 become logic low. When both the signals received from the input ports IN1 and IN2 are logic high, the output signal of the AND gate AND1 is logic high. Thus, the first switch signal output to the output port SW1 is enabled logic high, and the second through fourth switch signals output to the output ports SW2–SW4 are sequentially enabled logic high.

Figure 4:
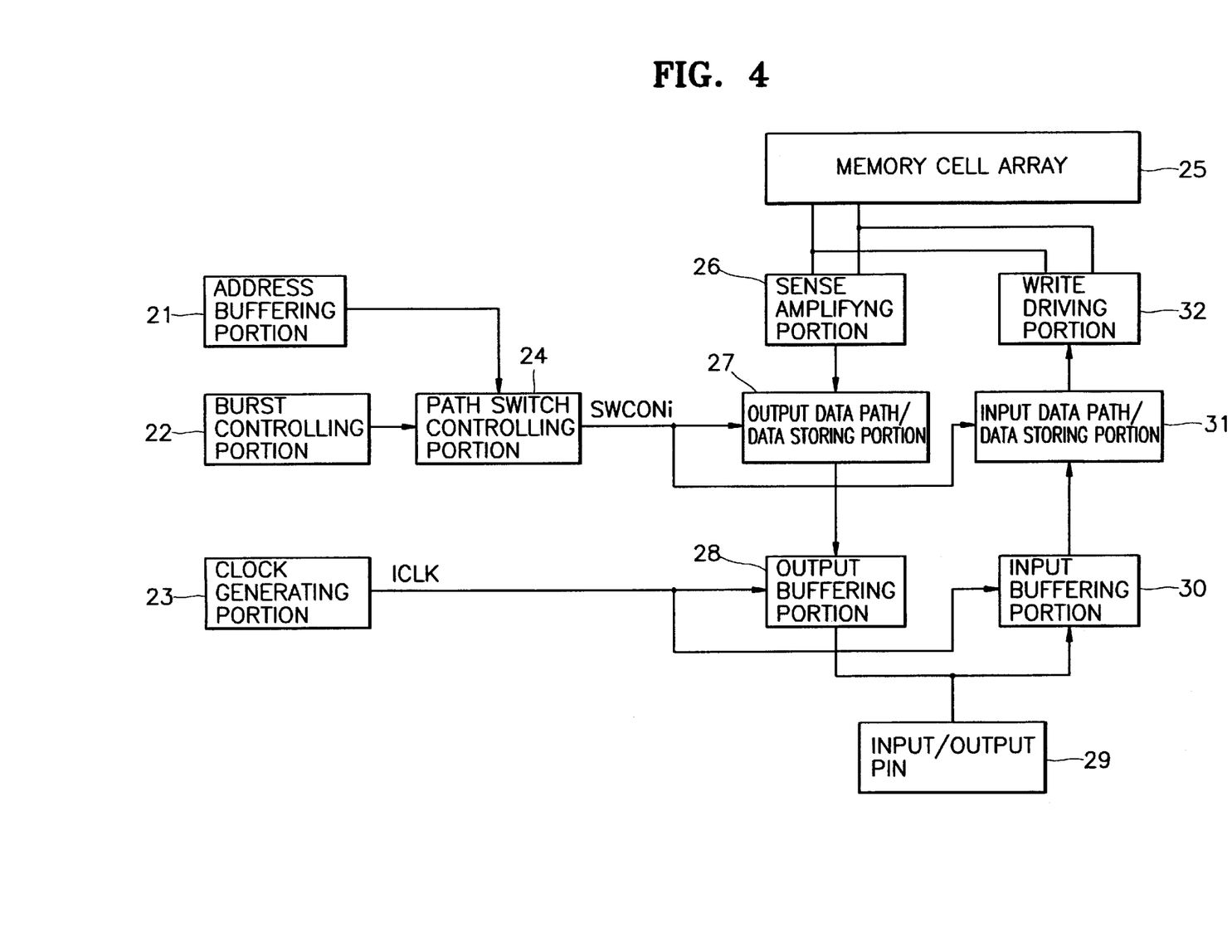
FIG. 4 is a schematic block diagram of synchronous SRAM devices according to an embodiment of the present invention.

FIG. 4 is a schematic block diagram of synchronous SRAM devices using switch signal generators of FIG. 3 according to an embodiment of the present invention. Since a burst control scheme is primarily illustrated in the block diagram of FIG. 4, basic read/write control paths are not shown.

Referring to FIG. 4, synchronous SRAM devices according to the present invention include an address buffering portion 21 for receiving an externally applied address, a burst controlling portion 22 for controlling a read/write operation and a burst mode setting, a clock generating portion 23 for generating an internal clock signal ICLK which is synchronized with an externally input system clock signal, and a path switch controlling portion 24 for generating a switch control signal SWCONI in response to the output signals of the address buffering portion 21 and the burst controlling portion 22.

In order to read data from a memory cell array 25, synchronous SRAM devices of the present invention further include a sense amplifying portion 26 for sensing and amplifying data transmitted from the memory cell array 25, an output data path/data storing portion 27 for storing an output signal of the sense amplifying portion 26, and simultaneously setting output paths of the stored output signal in response to the switch control signal SWCONi, and an output buffering portion 28 for buffering an output signal of the output data path/data storing portion 27 in response to the internal clock signal ICLK and outputting the buffered signal through an input/output pin 29. To write externally input data in the memory cell array 25 during a burst write operation, synchronous SRAM devices of the present invention also include an input buffering portion 30 for buffering a signal externally received through the input/output pin 29 in response to the internal clock signal ICLK, an input data path/data storing portion 31 for simultaneously setting input paths of the input signal buffered in the input buffer 30 and storing the input signal, and a write driving portion 32 for writing an output signal of the input data path/data storing portion 31 in the memory cell array 25.

The above-described synchronous SRAM devices of FIG. 4 according to the present invention are different from conventional synchronous SRAM devices of FIG. 1, among other reasons, because the burst counting portion 4 of the conventional synchronous SRAM is replaced by the path switch controlling portion 24. Moreover, the switch control signal SWCONi which is the output signal of the path switch controlling portion 24, controls the output data path/data storing portion 27 and the input data path/data storing portion 31. The path switch controlling portion 24 includes switch signal generators shown in FIG. 3. A detailed description will be provided below. Synchronous SRAM devices of the present invention also may be embodied such that the switch control signal SWCONi controls the sense amplifying portion 26 and the write driving portion 32, or a word line or column selection line of the memory cell array 25.

Thus, in synchronous SRAM devices of FIG. 4, all burst orders and all data paths of the output data path/data storing portion 27 and the input data path/data storing portion 31 are set by the switch control signal SWCONI, simultaneously when a burst operation starts. Subsequent operations, including data output operations are not influenced by the control of the burst operation. This will be described in detail below referring to FIGS. 6 and 7.

Figure 5:
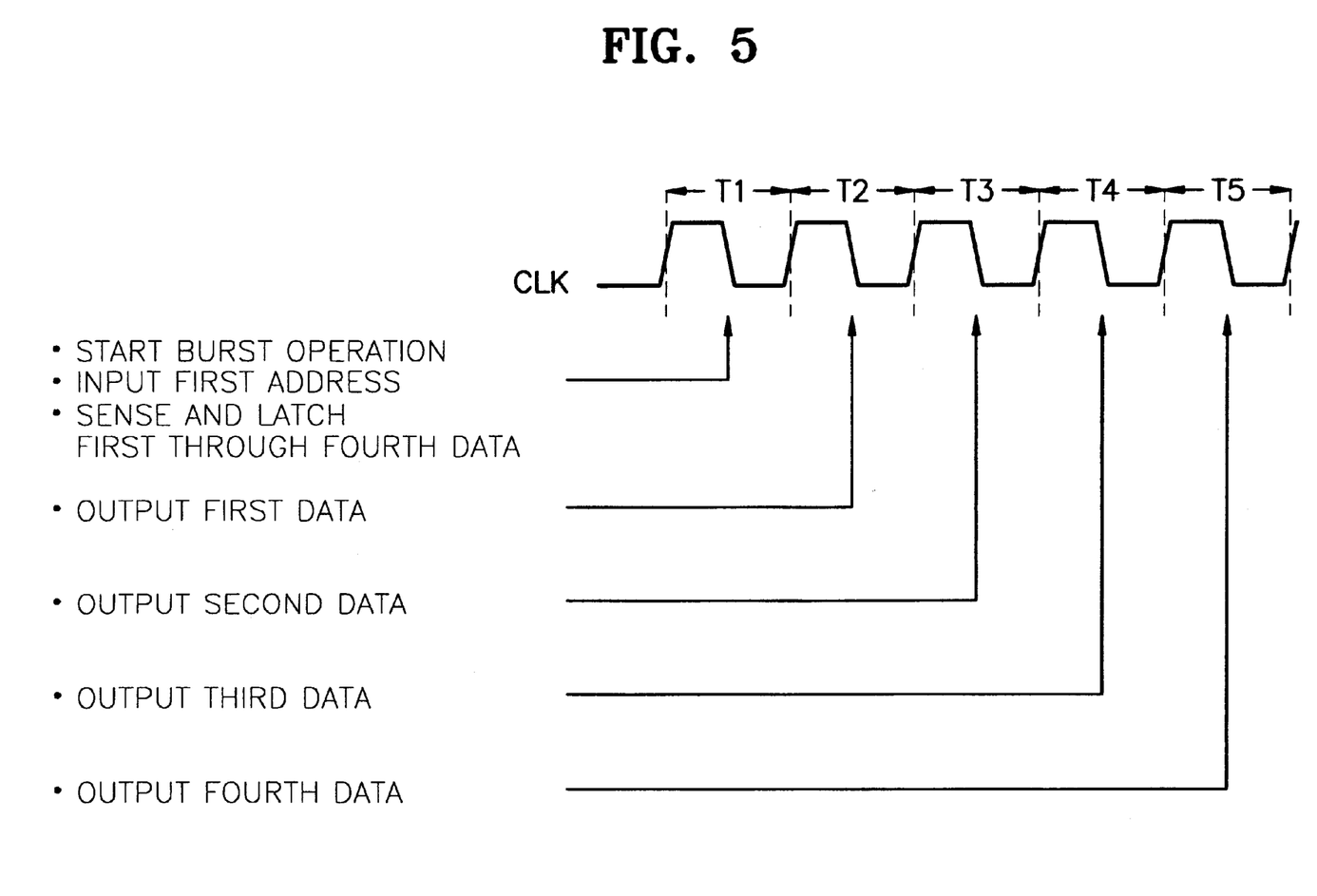
FIG. 5 is a timing diagram illustrating a burst read operation of SRAM devices shown in FIG. 4.

FIG. 5 is a timing diagram illustrating a burst read operation of a synchronous SRAM shown in FIG. 4. In FIG. 5, the burst length is 4 data units and a register-register mode is illustrated.

During a first cycle T1 of the system clock signal CLK, a burst mode is set by the burst controlling portion 22 in the synchronous SRAM of FIG. 4. Then, the burst operation starts. The sense amplifying portion 26 simultaneously senses and amplifies four data elements, that is first through fourth data, transmitted from the memory cell array 25 upon external input of a first address. The output data path/data storing portion 27 latches the sensed and amplified first through fourth data in response to the switch control signal SWCONi. Then, the latched first data is output through the input/output pin 29 by way of the output buffering portion 28 during a second cycle T2 of the system clock signal CLK, the latched second data is output during a third cycle T3, and the latched third data is output during a fourth cycle T4. During a fifth cycle T5, the latched fourth data is output. The first cycle T1 resumes if the read operation continues, and otherwise, the burst operation ends.

A burst write operation is performed in a path reverse to that for the above-described burst read operation, through input data paths. A detailed operation thereof need not be provided.

Figure 6:
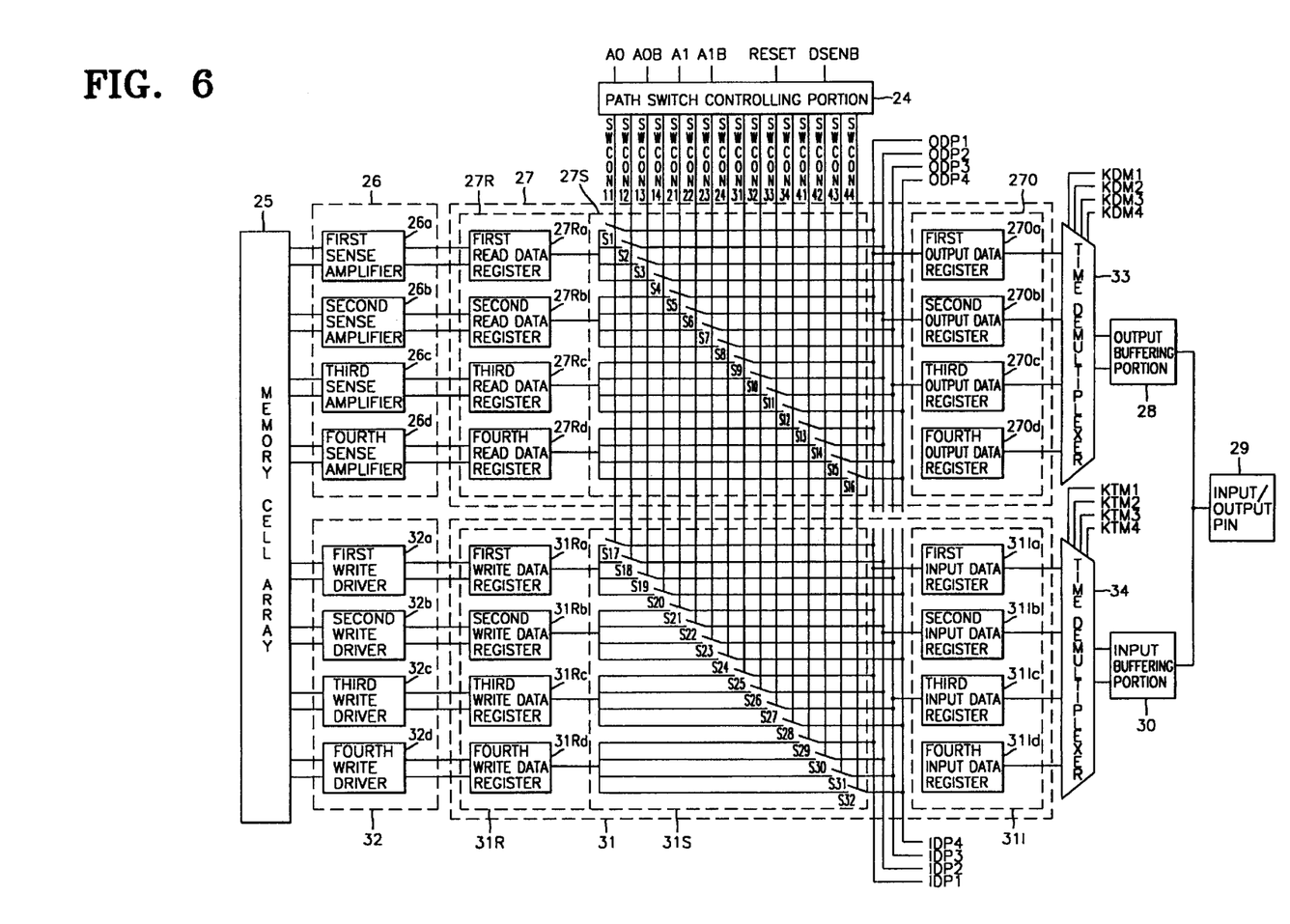
FIG. 6 is a detailed block diagram of a data path portion of a synchronous SRAM shown in FIG. 4.

FIG. 6 is a detailed diagram of a data path portion of a synchronous SRAM shown in FIG. 4. Like reference numerals denote the same components as those of FIG. 4.

Referring to FIG. 6, synchronous SRAM devices according to the present invention include the memory cell array 25, the sense amplifying portion 26, the output data path/data storing portion 27, a time demultiplexer 33, the output buffering portion 28, the input/output pin 29 and the input buffering portion 30. A time multiplexer 34, the input data path/data storing portion 31, the write driving portion 32, and the path switch controlling portion 24 are also included.

The sense amplifying portion 26 includes first through fourth sense amplifiers 26a–26d for sensing and amplifying data received from memory cells selected from the memory cell array 25, respectively. The output data path/data storing portion 27 includes a read data register block 27R, a path switch block 27S, output data path lines ODP1–ODP4, and an output data register block 270. The read data register block 27R is provided with first through fourth read data registers 27Ra–27Rd for storing the output signals of the sense amplifiers 26a–26d, respectively. The path switch block 27S is connected between the output terminals of the read data registers 27Ra–27Rd and the output data path lines ODP1–ODP4, and includes a plurality of path switches S1–S16 that are simultaneously controlled by switch control signals SWCON11SWCON44. In addition, the output data register block 270 includes first through fourth output data registers 270a–270d for storing signals transmitted through the output data path lines ODP1–ODP4, respectively. The output signals of the output data registers 270a–270d are demultiplexed in the time demultiplexer 33 and sequentially output to external of the SRAM by way of the output buffering portion 28 and the input/output pin 29.

The input data path/data storing portion 31 includes a write data register block 31R, a path switch block 31S, input data path lines IDP1–IDP4, and an input data register block 31I. The input data register block 31I is provided with first through fourth data registers 31Ia–31Id for storing signals sequentially received externally by way of the input/output pin 29, the input buffering portion 30, and the time multiplexer 34, and outputting the respective input signals to the input data path lines IDP1–IDP4. The write data register block 31R includes first through fourth write data registers 31Ra–31Rd for storing signals that are provided at their input terminals. The path switch block 31S is connected between the input terminals of the write data registers 31Ra–31Rd and the input data path lines IDP1–IDP4, and includes a plurality of path switches S17–S32 which are simultaneously controlled by the switch control signals SWCON11–SWCON44. In addition, the write driving portion 32 includes first through fourth write drivers 32a–32d for receiving the output signals of the write data registers 31Ra–31Rd and writing the received signals in memory cells selected from the memory cell array 25.

The path switch controlling portion 24 receives first and second control signals RESET and DSENB, a plurality of address bits A0 and A1, and a plurality of inverted address bits A0B and A1B, the address bits and the inverted address bits are applied at the start of the burst operation, and the path switch controlling portion 24 generates the switch control signals SWCON11–SWCON44. The first control signal RESET is sent in conjunction with the end or stop of the burst operation, and the second control signal IDSENB enables the path switch controlling portion 24 and is sent in conjunction with read/write operations and a burst mode (a linear burst mode and an interleave burst mode). Each of the read data registers 27Ra–27Rd is connected to one of the output data path lines ODP1–ODP4 by activating one of the four path switches, which are connected to the output terminals of the read data registers, by means of one of the switch control signals SWCON11–SWCON44. In addition, each of the write data registers 31Ra–31Rd is connected to one of the input data path lines IDP1–IDP4 by activating one of the four path switches, which are connected to the input terminals of the write data registers, by means of one of the switch control signals SWCON11–SWCON44.

Figure 7:
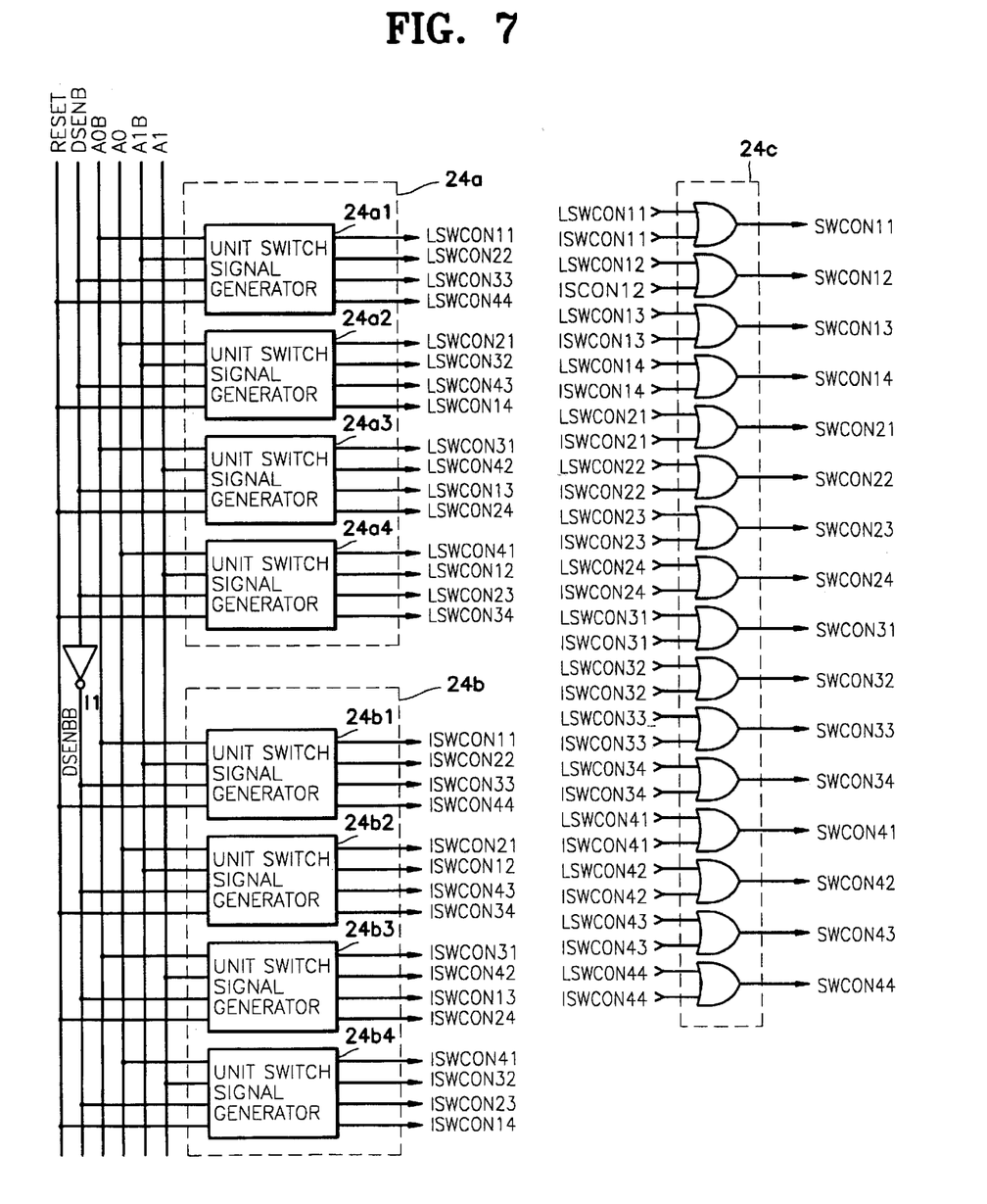
FIG. 7 is a detailed diagram of the path switch controlling portion of a synchronous SRAM of FIG. 6.

FIG. 7 is a detailed diagram of the path switch controlling portion 24 of a synchronous SRAM of FIG. 6. Referring to FIG. 7, the path switch controlling portion is provided with a first switch signal generating portion 24a, a second switch signal generating portion 24b, and a logic means 24c.

The first switch signal generating portion 24a serves to set all burst orders at a linear burst mode, and generates a first group of 16 switch signals LSWCON11–LSWCON44 in response to the first and second control signals RESET and DSENB, the plurality of address bits A0 and A1, and the plurality of inverted address bits A0B and A1B. The first switch signal generating portion 24a is activated at the linear burst mode, that is, when the second control signal DSENB is logic low, and includes four unit switch signal generators 24a1–24a4. The unit switch signal generators 24a1–24a4 each have the same circuitry as that of the switch signal generator shown in FIG. 3.

Figure 8:
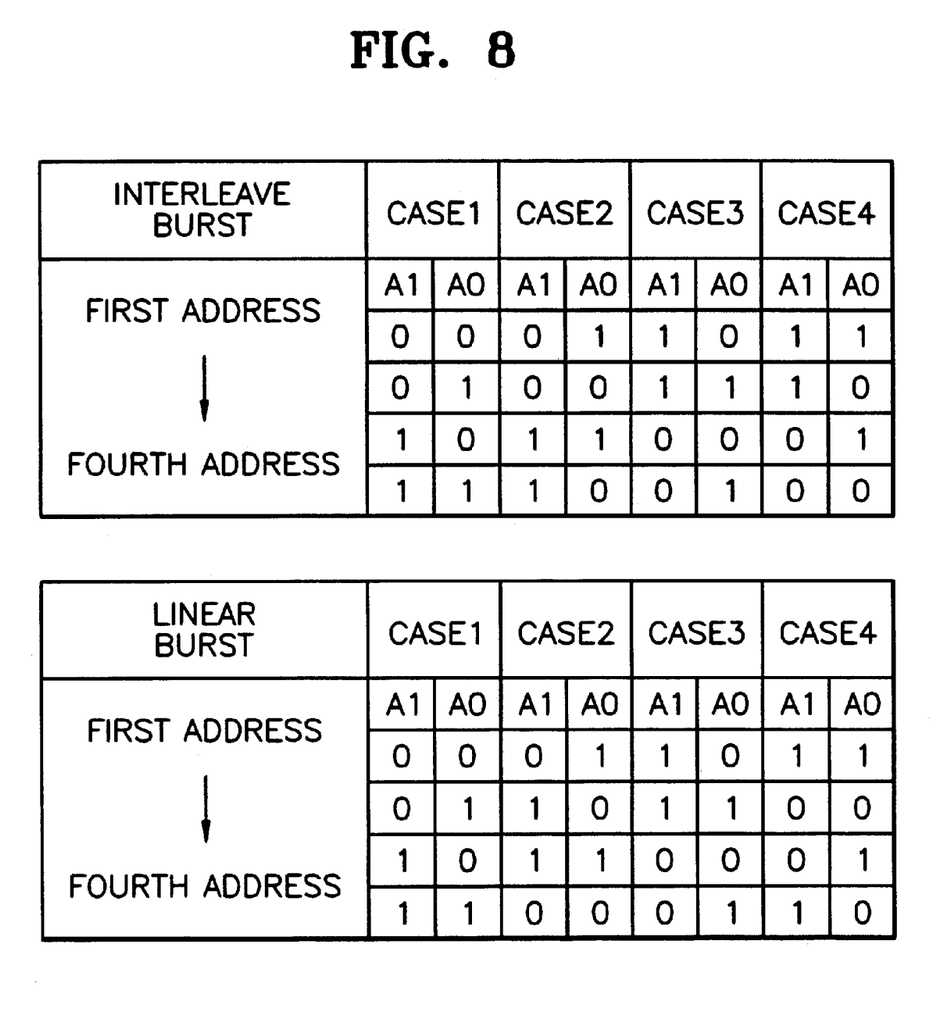
FIG. 8 illustrates address tables for a linear burst mode and an interleave burst mode in a synchronous SRAM.

The unit switch signal generator 24a1 outputs switch signals LSWCON11, LSWCON22, LSWCON33, and LSWCON44 corresponding to burst orders of case 1 at the linear burst mode shown in FIG. 8 to the output ports SW1, SW2, SW3, and SW4, respectively, in response to A1B, A1B, RESET, DSEND respectively input to both the input ports IN1 and IN2 and both the control ports CNT1 and CNT2. The unit switch signal generator 24a2 outputs switch signals LSWCON21, LSWCON32, LSWCON43, and LSWCON14 corresponding to burst orders of case 2 at the linear burst mode shown in FIG. 8 to the output ports SW1, SW2, SW3, and SW4, respectively, in response to A0, A1B, RESET, DSENE respectively input to both the input ports IN1 and IN2 and both the control ports CNT1 and CNT2.

The unit switch signal generator 24a3 outputs switch signals LSWCON31, LSWCON42, LSWCON13, and LSWCON24 corresponding to burst orders of case 3 at the linear burst mode shown in FIG. 8 to the output ports SW1, SW2, SW3, and SW4, respectively, in response to A0B, A1, RESET, DSENB respectively input to both the input ports IN1 and IN2 and both the control ports CNT1 and CNT2. The unit switch signal generator 24a4 outputs switch signals LSWCON41, LSWCON12, LSWCON23, and LSWCON34 corresponding to burst orders of case 4 at the linear burst mode shown in FIG. 8 to the output ports SW1, SW2, SW3, and SW4, respectively, in response to A0, A1, RESET, DSENB respectively input to both the input ports IN1 and IN2 and both the control ports CNT1 and CNT2.

The second switch signal generating portion 24b serves to set all burst orders at an interleave burst mode, and generates a second group of 16 switch signals ISWCON11–ISWCON44 in response to the first control signal RESET, the inverted signal DSENBB of the second control signal DSENB, inverted in the inverter Ii, the plurality of address bits A0 and A1, and the plurality of inverted address bits A0B and A1B. The second switch signal generating portion 24b is activated at the interleave burst mode, that is, when the second control signal DSENB is logic high, and includes first through fourth unit switch signal generators 24b1–24b4. The unit switch signal generators 24b1–24b4 each have the same circuitry as that of the switch signal generator shown in FIG. 3.

The unit switch signal generator 24b1 outputs switch signals ISWCON11, ISWCON22, ISWCON33, and ISWCON44 corresponding to burst orders of case 1 at an interleave linear burst mode shown in FIG. 8 to the output ports SW1, SW2, SW3, and SW4, respectively, in response to A0B, A1B, RESET, DSENBB respectively input to both the input ports IN1 and IN2 and both the control ports CNT1 and CNT2. The unit switch signal generator 24b2 outputs switch signals ISWCON21, ISWCON12, ISWCON43, and ISWCON34 corresponding to burst orders of case 2 at the interleave linear burst mode shown in FIG. 8 to the output ports SWi, SW2, SW3, and SW4, respectively, in response to A0, A13, RESET, DSENBB respectively input to both the input ports IN1 and IN2 and both the control ports CNT1 and CNT2.

The unit switch signal generator 24b3 outputs switch signals ISWCON31, ISWCON42, ISWCON13, and ISWCON24 corresponding to burst orders of case 1 at the interleave linear burst mode shown in FIG. 8 to the output ports SW1, SW2, SW3, and SW4, respectively, in response to A0B, A1, RESET, DSENBB respectively input to both the input ports IN1 and IN2 and both the control ports CNT1 and CNT2. In addition, the unit switch signal generator 24b4 outputs switch signals ISWCON41, ISWCON32, ISWCON23, and ISWCON14 corresponding to burst orders of case 4 at the interleave linear burst mode shown in FIG. 8 to the output ports SW1, SW2, SW3, and SW4, respectively, in response to A0, A1, RESET, DSENBB respectively input to both the input ports IN1 and IN2 and both the control ports CNT1 and CNT2.

The logic means 24c includes 16 OR-gates each for OR-operating one of the first group of switch signals LSWCON11–LSWCON44 and one of the second group of switch signals ISCON11–ISCON44. The logic means 24c generates a corresponding switch control signal among the switch control signals SWCON11–SWCON44.

A burst control scheme and a data path control scheme of a synchronous SRAM according to the present invention will be described referring to FIGS. 6 and 7. When the burst operation starts and a first burst address is externally applied, the states of the first and second control signals RESET and DSENB, the plurality of address bits A0 and A1, and the plurality of inverted address bits A0B and A12 are determined. For example, when both the first and second control signals RESET and DSENB are logic low, that is, a linear burst mode is set, and both A0 and A1 are logic high, only the unit switch signal generator 24a4 of the first switch signal generating portion 24a shown in FIG. 7 is activated. That is, four switch signals LSWCON41, LSWCON12, LSWCON23, and LSWCON34 being the output signals of the unit switch signal generator 24a4 among the first group of 16 switch signals LSWCON11–LSWCON44 and the second group of 16 switch signals ISCON11–ISCON44 is enabled logic high, and the others are disabled logic low. Thus, only four switch signals SWCON41, SWCON12, SWCON23, and SWCON34 among the 16 switch signals SWCON11–SWCON44 being the output signals of the logic means 24c are enabled logic high, and the others are logic low.

Therefore, by turning on path switches S2, S7, S12, and S13 of the path switch block 27S shown in FIG. 6, the output terminal of the first read data register 27Ra is connected to the input terminal of the output data register 270b, the output terminal of the second read data register 27Rb is connected to the input terminal of the third output data register 270c, and the output terminal of the third read data register 27Rc is connected to the input terminal of the fourth output data register 270d. In addition, by turning on path switches S13, S23, S28, and S29 of the path switch block 31S, the output terminal of the first input data register 31Ia is connected to the input terminal of the fourth write data register 31Rd, the output terminal of the second input data register 31Ib is connected to the input terminal of the first write data register 31Ra, and the output terminal of the third input data register 31Ic is connected to the input terminal of the second write data register 31Rb, and the fourth input data register 31Id is connected to the input terminal of the third write data register 31Rc.

As described above, in synchronous SRAM devices of the present invention, all burst orders can be set in the path switch controlling portion 24, simultaneously when the burst operation starts. All input and output data paths can be simultaneously set by the switch control signals SWCON11SWCON44 being the output signals of the path switch controlling portion 24.

Consequently, by applying switch signal generators of the present invention to synchronous SRAM devices, all input and output data paths can be simultaneously set. In addition, in synchronous SRAM devices using the switch signal generators, since all input and output data paths can be simultaneously set, a subsequent operation such as data output or input, need not be influenced by the control of the burst operation. Thus, in synchronous SRAM devices of the present invention, a high-speed burst operation can be performed, and data can be read or written in pairs in a single cycle to implement a double data rate function.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A synchronous SRAM device for performing a burst mode operation, comprising:
   an array of SRAM memory cells;
   sense amplifying means for simultaneously sensing and amplifying data of a plurality of SRAM memory cells in the array to produce a plurality of output signals;
   path switch controlling means for generating switch control signals;
   output data path setting means for simultaneously setting a plurality of output paths for the plurality of output signals of the sense amplifying means in response to the switch control signals;
   output buffering means for buffering the output signals from the output data path setting means in response to an internal clock signal;
   input buffering means for buffering a plurality of externally input signals in response to the internal clock signal;
   input data path setting means for simultaneously setting a plurality of input paths for the plurality of buffered signals in response to the switch control signals; and
   write driving means for simultaneously writing the buffered signals of the input data path setting means in a plurality of SRAM memory cells.

2. The device of claim 1, wherein the internal clock signal is synchronized with an externally input system clock signal and is generated internally.

3. The device of claim 1, wherein the path switch controlling means is responsive to address bits which are generated by an address externally applied during the burst mode operation.

4. The device of claim 1, wherein the path switch controlling means is responsive to a first control signal which indicates an end of the burst mode operation.

5. The device of claim 1, wherein the path switch controlling means is responsive to a second control signal which enables the path switch controlling means and selects one of a linear burst mode and an interleave burst mode.

6. The device of claim 1, wherein the output data path setting means comprises:
   read data register means for storing the plurality of output signals of the sense amplifying means;
   a plurality of output data path lines;
   path switch means for connecting the output terminals of the read data register means to the respective output data path lines; and
   output data register means for storing signals transmitted through the respective output data path lines and for outputting the stored signals to the output buffering means.

7. The device of claim 6, wherein read data register means comprises a plurality of read data registers and wherein the path switch means comprises a plurality of path switches which are connected between the output terminals of the plurality of read data registers and the respective output data path lines, and which are controlled by the switch control signals.

8. The device of claim 1, wherein the input data path setting means comprises:
    write data register means for storing signals received through the input terminals and for outputting the stored signals to the write driving means;
    a plurality of input data path lines;
    path switch means for connecting the input terminals of the write data register block to the respective input data path lines in response to the switch control signals; and
    input data register means for storing the signals buffered in the input buffering means and outputting the stored signals to the respective SRAM memory cells.

9. The device of claim 8, wherein the path switch means comprises a plurality of path switches which are connected between the input terminals of the plurality of write data registers in the write data register means and the respective input data path lines, and which are controlled by the switch control signals.

10. The device of claim 1, wherein the path switch controlling means comprises:
    first switch signal generating means for generating a group of switch signals in response to first and second control signals, to address bits and to inverted address bits of the address bits;
    second switch signal generating means for generating a second group of switch signals in response to the first control signal, the inverted signal of the second control signal, the address bits and the inverted address bits; and
    logic means including a plurality of OR means for OR-operating one of the first group of switch signals and one of the second group of switch signals and for outputting the switch control signals.

11. The device of claim 10, wherein the first switch signal generating means comprises a plurality of unit switch signal generating means for generating some of the first group of switch signals as output signals in response to bits selected from the address bits and the inverted address bits and the first and second control signals, and for sequentially enabling the remaining output signals when the first output signal is enabled.

12. The device of claim 11, wherein the unit switch signal generating means comprise first logic means for receiving the first and second control signals and the selected bits, for performing a logic operation on the received bits and signals and for generating the first output signal, and second logic means for receiving the first output signal and the first control signal and for sequentially generating the other output signals.

13. The device of claim 10, wherein the second switch signal generating means comprises a plurality of unit switch signal generating means for generating some of the second group of switch signals as output signals in response to bits selected from the address bits and the inverted address bits, the first control signal, and the inverted signal of the second control signal, and for sequentially enabling remaining output signals when a first output signal is enabled.

14. The device of claim 13, wherein the unit switch signal generating means each comprise first logic means for receiving the first and second control signals and the selected bits, for performing a logic operation on the received signals and bits and for generating the first output signal, and second logic means for receiving the first output signal and the first control signal and for sequentially generating the other output signals.

15. A synchronous SRAM device for performing a burst mode operation, comprising:

an array of SRAM memory cells;
a path switch controller which generates switch control signals;
a plurality of sense amplifiers which sense and amplify data of memory cells;
a plurality of read data registers, a respective one of which stores data output from a respective one of the sense amplifiers;
a plurality of output data path lines;
plurality of read path switches which are connected between the respective read data registers and the respective output data path lines, and which are simultaneously controlled by the switch control signals;
a plurality of output data registers which store data transmitted through the respective output data path lines;
plurality of input data path lines;
plurality of input data registers which store sequentially input data and which output the stored data to the respective input data path lines;
a plurality of write data registers which store data input to the respective input terminals thereof;
a plurality of write path switches which are connected between the input terminals of the respective write data registers and the respective input data path lines and which are simultaneously controlled by the switch control signals; and
a plurality of write drivers which write the output data of the respective write data registers in memory cells.

16. The device of claim 15, wherein the path switch controller is responsive to address bits which are generated by an address externally input during the burst mode operation.

17. The device of claim 15, wherein the path switch controller is responsive to a first control signal which indicates end of the burst mode operation.

18. The device of claim 15, wherein the path switch controller is responsive to a second control signal which enables the path switch controller and selects one of a linear burst mode and an interleave burst mode.

19. The device of claim 15, wherein the path switch controller comprises:
    a first switch signal generator which generates a group of switch signals in response to the first and second control signals, address bits and inverted bits of the address bits;
    a second switch signal generator which generates a second group of switch signals in response to the first control signal, an inverted signal of the second control signal, the address bits and the inverted address bits; and
    a plurality of OR gates which OR-operate one of the first group of switch signals and one the second group of switch signals, and which generate the respective switch signals.

20. The device of claim 19, wherein the first switch signal generator comprises a plurality of unit switch signal generators which generate some of the first group of switch signals as output signals in response to bits selected from the address bits and the inverted address bits and in response to the first and second control signals, and which sequentially enable the remaining output signals when a first output signal is enabled.

21. The device of claim 20, wherein the unit switch signal generators each comprise a first logic circuit which receives the first and second control signals and the selected bits, which performs a logic operation on the received signals and bits and which generates the first output signal, and a second logic circuit which receives the first output signal and the first control signal and which sequentially generates the other remaining signals.

22. The device of claim 19, wherein the second switch signal generator comprises a plurality of unit switch signal generators which generate some of the second group of switch signals as output signals in response to bits selected from the address bits and the inverted address bits, the first control signal and the inverted signal of the second control signal, and which sequentially enable the remaining output signals when a first output signal is enabled.

23. An integrated circuit switch signal generator device, comprising:
   first logic means, responsive to first and second control signals and to a plurality of input signals, for performing logic operations to generate a first switch signal; and
   second logic means, responsive to the first switch signal and to the first control signal, for sequentially generating a plurality of other switch signals, and for sequentially enabling the plurality of other switch signals when the first switch signal is enabled.

24. The device of claim 23, wherein the first logic means comprises:
   NOR means, responsive to the first and second control signals, for NOR-operating the first and second control signals; and
   AND means, responsive to the NOR means and to the plurality of input signals, for AND-operating the received signals to generate the first switch signal.

25. The device of claim 23, wherein the second logic means comprises a plurality of serially connected unit logic means, each unit logic means including inverting means for inverting a switch signal output from the preceding unit logic means, and NOR means for NOR-operating an output signal of the inverting means and the first control signal to generate a switch signal.

26. A memory device comprising:
   an array of memory cells;
   sense amplifying means for simultaneously sensing and amplifying data of a plurality of memory cells in the array to produce a plurality of output signals;
   means for selecting a plurality of output paths for the plurality of output signals of the sense amplifying means, during a single clock cycle;
   means for buffering a plurality of externally input signals;
   means for selecting a plurality of input paths for the plurality of buffered signals, during a single clock cycle; and
   write driving means for simultaneously writing the buffered signals from the selected plurality of input paths into a plurality of memory cells in the array.

27. The device of claim 26, wherein the single clock cycle is a same clock cycle for setting the plurality of output paths and the plurality of input paths.

28. The device of claim 26, wherein the output path selecting means comprises means for sequentially selecting an output path for each of the plurality of output signals of the sense amplifying means during the single clock cycle.

29. The device of claim 26, wherein the input path selecting means comprises means for sequentially selecting an input path for each of the plurality of buffered signals during the single clock cycle.

30. A memory device comprising:
   an array of memory cells;
   a plurality of sense amplifiers which sense and amplify data of memory cells;
   a plurality of output data path lines;
   a plurality of read path switches between the respective sense amplifiers and the respective output data path lines, selected ones of which are activated during a single clock cycle to simultaneously set a plurality of output paths for the memory device during the single clock cycle;
   a plurality of input data path lines;
   a plurality of write drivers which write the input data into memory cells; and
   a plurality of write path switches between the respective input data path lines and the respective write drivers, selected ones of which are activated during a single clock cycle to simultaneously set a plurality of input paths for the memory device during the single clock cycle.

31. The device of claim 30, wherein the single clock cycle is a same clock cycle for setting the plurality of output paths and the plurality of input paths.

32. The device of claim 30, wherein the read path switches sequentially set the plurality of output paths for the memory device during the single clock cycle.

33. The device of claim 30, wherein the write path switches sequentially set the plurality of input paths for the memory device during the single clock cycle.

34. A method of operating a memory device including an array of memory cells, the method comprising the steps of:
   simultaneously sensing and amplifying data of a plurality of memory cells in the array to produce a plurality of output signals;
   selecting a plurality of output paths for the plurality of output signals during a single clock cycle;
   buffering a plurality of externally input signals;
   selecting a plurality of input paths for the plurality of buffered signals, during a single clock cycle; and
   simultaneously writing the buffered signals from the selected plurality of input paths into a plurality of memory cells in the array.

35. The method of claim 34, wherein the single clock cycle is a same clock cycle for setting the plurality of output paths and the plurality of input paths.

36. The method of claim 34, wherein the output path selecting step comprises the step of sequentially selecting an output path for each of the plurality of output signals of the sense amplifying means during the single clock cycle.

37. The method of claim 34, wherein the input path selecting step comprises the step of sequentially selecting an input path for each of the plurality of buffered signals during the single clock cycle.

* * * * *